(12) United States Patent
Grant et al.

(10) Patent No.: US 12,091,310 B2
(45) Date of Patent: Sep. 17, 2024

(54) INTEGRATED CIRCUIT PACKAGES HAVING STRESS-RELIEVING FEATURES

(71) Applicant: TallannQuest LLC, Plano, TX (US)

(72) Inventors: David A. Grant, Edinburgh (GB); Abhijeet Ghoshal, Plano, TX (US)

(73) Assignee: Apogee Semiconductor, Inc., Plano, TX (US)

( * ) Notice: Subject to any disclaimer, the term of this patent is extended or adjusted under 35 U.S.C. 154(b) by 640 days.

(21) Appl. No.: 17/331,762

(22) Filed: May 27, 2021

(65) Prior Publication Data
US 2021/0371271 A1 Dec. 2, 2021

Related U.S. Application Data

(60) Provisional application No. 63/030,897, filed on May 27, 2020.

(51) Int. Cl.
| | |
|---|---|
| *B81B 3/00* | (2006.01) |
| *B81C 1/00* | (2006.01) |
| *H02N 10/00* | (2006.01) |

(52) U.S. Cl.
CPC ........ *B81B 3/0072* (2013.01); *B81C 1/00666* (2013.01); *H02N 10/00* (2013.01);
(Continued)

(58) Field of Classification Search
CPC ... H01L 2224/0235; H01L 2224/02351; H01L 2224/0237–0239; B81B 3/0072;
(Continued)

(56) References Cited

U.S. PATENT DOCUMENTS

| | | | |
|---|---|---|---|
| 6,333,583 B1 * | 12/2001 | Mahadevan | .......... B81B 3/0024 60/527 |
| 6,841,413 B2 | 1/2005 | Liu et al. | |

(Continued)

FOREIGN PATENT DOCUMENTS

| | | | | |
|---|---|---|---|---|
| CN | 109384191 A | * | 2/2019 | ........... B81B 3/0024 |
| CN | 112141997 A | * | 12/2020 | |
| KR | 20110077522 A | * | 7/2011 | |

OTHER PUBLICATIONS

Foreign reference CN109384191 with machine translation (Year: 2019).*
(Continued)

*Primary Examiner* — Shahed Ahmed
*Assistant Examiner* — Sun Mi Kim King
(74) *Attorney, Agent, or Firm* — Gregory A. Magel

(57) ABSTRACT

Expansion compensating structures are formed in redistribution layers of a wafer-level chip-scale integrated circuit package (WLCSP) or other IC package having a low-expansion substrate. The structures include micromechanical actuators designed and oriented to move solder bumps attached to them in the same direction and distance as a function of temperature as do pads to which they may be connected on a higher-expansion substrate such as a printed circuit board. Expansion compensated IC packages incorporating these expansion compensating structures are provided, as well as expansion compensated assemblies containing one or more of these IC packages. Methods of fabricating expansion compensated IC packages requiring minimal changes to existing commercial WLCSP fabrication processes are also provided. These devices and methods will result in assemblies having improved board-level reliability during thermal cycling, and allow the use of larger IC die sizes in WLCSP technology.

20 Claims, 11 Drawing Sheets

(52) U.S. Cl.
CPC ..... *B81B 2201/031* (2013.01); *B81B 2207/07* (2013.01); *H01L 2224/0235* (2013.01)

(58) Field of Classification Search
CPC .......... B81B 2201/031; B81B 2207/07; B81B 7/0048; B81C 1/00666; H02N 10/00
See application file for complete search history.

(56) References Cited

U.S. PATENT DOCUMENTS

| | | | |
|---|---|---|---|
| 7,932,615 B2* | 4/2011 | Rinne | H01L 24/16 257/738 |
| 9,224,681 B2 | 12/2015 | Ebefors et al. | |
| 9,334,153 B1* | 5/2016 | Perahia | B81C 1/00301 |
| 2003/0222353 A1* | 12/2003 | Yamada | H01L 24/05 257/773 |
| 2004/0053483 A1* | 3/2004 | Nair | H01L 21/2885 257/E23.021 |
| 2010/0019347 A1* | 1/2010 | McLellan | H01L 23/642 257/532 |

OTHER PUBLICATIONS

Foreign reference KR 20110077522 with machine translation (Year: 2011).*

Foreign reference CN 112141997 with machine translation (Year: 2020).*

Que et al., Bent-Beam Electrothermal Actuators-Part I: Single Beam and Cascaded Devices, Journal of Microelectromechanical Systems, vol. 10, No. 2, Jun. 2001, pp. 247-254, doi: 10.1109/84.925771.

Li et al., A Wide Area Vertical Expansion (WAVE[TM]) packaging process development, Proceedings. 51st Electronic Components and Technology Conference, 2001, Orlando, FL, pp. 367-371, doi: 10.1109/ECTC.2001.927750.

Rosson, NanoStar[TM] & NanoFree[TM] 300um Solder Bump Wafer Chip-Scale Package Application, Texas Instruments Application Report SBVA017, Feb. 2004.

Chang et al., A Novel Design Structure for WLCSP With High Reliability, Low Cost, and Ease of Fabrication, IEEE Transactions on Advanced Packaging, vol. 30, No. 3, Aug. 2007, pp. 377-383, doi: 10.1109/TADVP.2007.901773.

Kwan et al., Designs for improving the performance of an electrothermal in-plane actuator, IEEE/IFIP 19th International Conference on VLSI and System-on-Chip, 2011, Hong Kong, China, pp. 220-225, doi: 10.1109/VLSISoC.2011.6081641.

Microsemi, Ceramic col. Grid Array, Application Note AC190, Jun. 2019, Microsemi Corporation, Aliso Viejo, CA.

Lau et al., Redistribution Layers (RDLs) for 2.5D/3D IC Integration, Journal of Microelectronics and Electronic Packaging, vol. 11, No. 1, 2014, pp. 16-24, doi: 10.4071/imaps.406.

* cited by examiner

INTEGRATED CIRCUIT PACKAGES HAVING STRESS-RELIEVING FEATURES

This application claims the benefit under 35 U.S.C. 119(e) of U.S. Provisional Application No. 63/030,897, filed May 27, 2020, which is incorporated herein by reference.

BACKGROUND OF THE INVENTION

1. Field of the Invention

The present invention relates generally to packaging semiconductor integrated circuits, and, more particularly, to structures and methods that relieve stress on solder joints between substrates having mismatched coefficients of thermal expansion and result in improved board-level reliability.

2. Description of the Related Art

One of the functions of an integrated circuit package is to absorb the difference in coefficients of thermal expansion (CTE) between a semiconductor integrated circuit chip (typically silicon, with a low CTE~2.6 ppm/° C.) and an organic printed circuit board (PCB) which most commonly uses layers of a fiberglass-reinforced epoxy composite material such as FR-4 alternating with conducting layers that are typically copper (together having a significantly higher CTE~17 ppm/° C.). The difference in spacing (pitch) caused by the higher resolution of IC fabrication processes compared to lower-resolution PCB fabrication processes usually necessitates a package having a redistribution capability for the locations of the electrical connections. Although leaded packages can provide mechanical compliance to absorb the difference in expansion, the trend is toward using leadless packages with arrays of solder bumps or balls. Leadless packages have many advantages including smaller dimensions, higher contact count per unit area, lower inductance, and better thermal conductivity through the short metal path of the solder bumps. An example is a ball grid array (BGA) package, in which the IC die is typically attached to another substrate, and redistribution layers (RDL) may be used to fan-in or fan-out contacts from very fine-pitch perimeter IC bond pads to a larger-pitch area array of solder balls that are used to attach the package to a PCB. Wafer-level chip-scale packages (WLCSP), in which one or more RDL and an array of solder bumps can be applied to the IC die at the wafer level before the wafer is diced, instead of packaging separate dice, can result in very compact packaged ICs the same size as the die, and in the case of fan-in WLCSP, can incorporate redistribution within the die footprint. But the small height of the solder bumps and the large difference in CTE between the WLCSP and a PCB lead to high shear stresses at the solder bumps due to changes in temperature.

In applications that experience large and/or frequent temperature swings, the resulting high cyclical shear stresses result in poor board-level reliability (BLR), with failures caused by fatigue and cracking of the solder bump connections, delamination, or other mechanical failures of the associated layers in the package, IC, or PCB. Nowhere is high BLR more important than in space applications, which not only require higher reliability, but also encounter extended temperature ranges and frequent large temperature excursions. For example, a typical Low Earth Orbit (LEO) satellite will alternate between a very hot "day" and a very cold "night" every 90 minutes. A commercial leadless package like the QFN (Quad Flat No-Lead) package, while widely used in commercial applications for its low inductance and good thermal dissipation performance, may be unacceptable in space applications due to its inability to absorb CTE mismatches.

Several techniques have been developed to mitigate the shear stresses caused by CTE mismatch, with varying effectiveness and complexity (and thus cost). An underfill encapsulant material, typically an epoxy composition, can be used to connect an IC chip to a higher-CTE substrate. The underfill spreads some of the stress and limits the strain at the solder bumps, but underfill, applied using capillary action and heat curing, requires additional assembly steps, and materials, and handling, makes rework difficult. While underfill used in flip chip assemblies within a BGA package, it is rarely used with WLCSP on a PCB. Within a WLCSP or similar package, several solutions have been proposed to add compliance around the solder joints to reduce the stress on the joints: soft (low modulus) dielectric or additional stress buffer layers, or even layers designed to fracture, can be included under the solder bumps to add compliance there; taller metal posts under the solder bumps can increase the gap between chip and PCB, or tall solder posts in a "column grid array" can reduce the stress in the solder. Even microsprings formed with flexible leads or bond wires have been introduced to add compliance. Additional interposer layers with intermediate CTE have been proposed, as has thinning the IC substrate and bonding it directly to a metal heat spreader so that it takes on some of the mechanical/thermal properties of the heat spreader. All of these solutions add complexity and thus cost to the production of the IC package, and some fragility, in that even compliant structures must still absorb the lateral strain. For larger die sizes or distance to the neutral point (DNP), the joints suffer more severe shear strains.

Space-qualified components sometimes employ larger design rules and redundancy to implement radiation-hardened designs. While advanced commercial ICs are sensitive to die sizes and thus costs, die size is not such an issue in aerospace and similar high-reliability markets, nor in power electronics, particularly in harsh environments. There thus remains a need for IC package technologies that accommodate larger die sizes with improved board level reliability, but that can be implemented using established commercial package fabrication methods.

SUMMARY OF THE INVENTION

The present invention addresses the problems of shear stress caused by changes in temperature, and fatigue cracking due to thermal cycling, leading to failures in solder joints such as solder bumps and the associated connective structures between two substrates having different coefficients of thermal expansion (CTE). Micromechanical expansion compensating structures are formed on a substrate having a lower CTE, which may be for example a silicon integrated circuit substrate in a wafer-level chip-scale package (WLCSP) acting as the package substrate, that is intended to be attached at a plurality of connection locations to a higher-level interconnect substrate, such as a printed circuit board, that has a higher CTE than that of the package substrate. The expansion compensating structures are designed and fabricated so as to physically move the solder bumps with respect to the lower-CTE package substrate, in the same direction and with the same displacement that the connection locations experience due to thermal expansion of the higher CTE interconnect. Solder joints at the connection locations, while remaining electrically and thermally connected to the lower-CTE package substrate through the expansion compensating structures, move approximately as if they were attached only to the higher-level interconnect substrate, thus resulting in greatly reduced shear stresses and hence higher reliability. Embodiments of novel expansion compensating structures provided by the present invention can be fabricated at low cost using the same materials, and using similar processes to those already used in the commercial production of WLCSPs. The invention has application not only to WLCSPs, but to other assemblies containing a mix of substrates having different coefficients of thermal expansion, including some on which expansion compensating structures may be formed, such as a low-CTE interposer in a stacked 2.5D or 3D package.

More specifically, the present invention provides an expansion compensating structure in an integrated circuit package, having an anchor rigidly attached to the package substrate, a bump pad formed in a redistribution layer parallel to a surface of the package substrate, and an actuator connecting the bump pad to the anchor, the actuator configured to move the bump pad approximately along a line lying in the plane of the redistribution layer by a predetermined displacement for a given change in the package temperature. Alternative embodiments of the expansion compensating structure may have a handle portion for the actuators to act upon between the actuator and the bump pad, or an additional compliant link between the actuator and the bump pad. Actuators used to achieve linear motion of the bump pad may include a chevron type with opposing angled beams, multiple-beam chevron structures, or other appropriate linear micromechanical actuators that can achieve sufficient displacement to compensate for the expansion of a higher-CTE substrate. Actuators may be formed in more than one actuator layers in order to increase out-of-plane stiffness and reduce a tendency for out-of-plane buckling.

The present invention also provides an expansion compensated package for integrated circuits, having a package substrate with a first coefficient of thermal expansion and a neutral point around which expansion occurs; at least one redistribution layer; and a plurality of expansion compensating structures, each having an anchor, a bump pad, and an actuator as described above. The expansion compensating structures are placed and oriented so as to position the bump pads in a predetermined pattern at a first temperature, and so that the actuators move the bump pads radially outward from the neutral point with increasing temperature. The actuators may be designed such that the displacement of a bump pad as a function of temperature is approximately proportional to the distance of the bump pad from the neutral point, and may substantially match the displacement of a mating pad on a higher-CTE substrate of a higher-level interconnect, thereby compensating for the difference in coefficient of thermal expansion between the package substrate and the higher-CTE substrate. The package substrate may be a silicon IC substrate in a wafer-level chip-scale package, a low-CTE interposer such as silicon or glass, or other low-CTE substrate. An expansion compensated package may have some bump pads that are not moved by an actuator, as well as some that are associated with expansion compensating structures. The expansion compensated package may also have a plurality of solder bumps attached to at least some of the bump pads.

The present invention further provides an expansion compensated assembly with at least one expansion compensated IC package having a package substrate with a first CTE and expansion compensating structures, and a higher-level interconnect such as a printed circuit board (PCB) or other organic substrate having a second, higher CTE than the IC package substrate. The expansion compensated package may be connected to the higher-level interconnect at a plurality of connection locations, and expansion compensating structures in the expansion compensated package can compensate for the difference in coefficient of thermal expansion between the package substrate and the higher-CTE substrate, in order to achieve high reliability due to reduced stress at the connection locations. The expansion compensated assembly may itself further have a plurality of solder balls, as in a plastic ball grid array (BGA) package, allowing it to be connected to another interconnect structure, such as a PCB.

The present invention additionally provides methods for fabricating expansion compensated packages such as expansion compensated WLCSP and their constituent expansion compensating structures. A first dielectric layer is deposited on a provided IC wafer or other low-CTE package substrate, and expansion compensating structures according to one of the embodiments herein are formed in a metal redistribution layer (RDL). Additional dielectric layers and redistribution layers may be deposited and patterned as needed to optionally increase a thickness of actuators in order to reduce out-of-plane buckling, and optional tie vias may be used to connect some of the actuator layers. After a last dielectric layer is deposited and patterned to open the dielectric layer over bump pads, an under bump metallization (UBM) is deposited and patterned, and solder bumps may be formed or attached to the UBM on some or all of the bump pads, resulting in either a complete wafer-level packaged IC, or another package layer such as an interposer. Embodiments of the process flow for fabricating expansion compensated packages are provided in which at least one RDL is formed either by processes comprising deposition, patterning, and etching steps, or by electroplating, in which metal seed layers are deposited and then thicker RDL metal layers are electroplated in openings in patterned photoresist to form one or more layers for actuators and other conductive traces. The RDL metal layers may be formed of a metal such as copper, chosen for its availability in an existing RDL process, and for favorable electrical, thermal, and mechanical properties such as high conductivity, CTE, Young's modulus, and fatigue behavior.

Other features and advantages of the present invention will be apparent to those of ordinary skill in the art upon reference to the following detailed description taken in conjunction with the accompanying drawings, which are to be understood to be exemplary and explanatory, and are intended to provide further explanation of the invention as claimed.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description. The techniques and structures described below may be applied in fields and applications beyond those specified here as examples, and the disclosed invention is therefore not to be considered limited to the applications and examples used here for the sake of explaining its principles of operation.

The present invention provides methods and structures for compensating mismatches in coefficients of thermal expansion (CTE) of integrated circuit (IC) or other electronic packaging materials used in mating substrates and interconnects. Electronic packaging materials can be organic, ceramic, metal, single crystal silicon, polysilicon, or glass. Substrates having a variety of CTE are often used together in electronic assemblies to take advantage of their respective properties and capabilities. For example, while IC die substrates are most frequently silicon (Si) having a low linear CTE of 2.6 ppm/° C., printed circuit boards (PCBs) and plastic package substrates have a much higher CTE of 14-18 ppm/° C., resulting from their construction of epoxy/glass composite insulating layers such as FR-4 and copper (Cu) conducting layers (~17 ppm/° C.). In chip packages, another organic bismaleimide-triazine material (BT-Epoxy) with a slightly lower, but still high (compared to Si) CTE of 13-14 ppm/° C. is often chosen due to its thermal stability. Glass substrates or interposers have a CTE that can be tailored by composition and processing within an intermediate range of approximately 3-8 ppm/° C. to better match the low Si CTE, as can metal alloys such as Kovar. The use of lower-CTE silicon and glass in assemblies with higher-CTE metals and organic materials results in differences in expansion that induce stresses where these substrates are connected, especially when fabricated, stored, transported, and/or operated over a wide range of temperatures.

Figure 1:
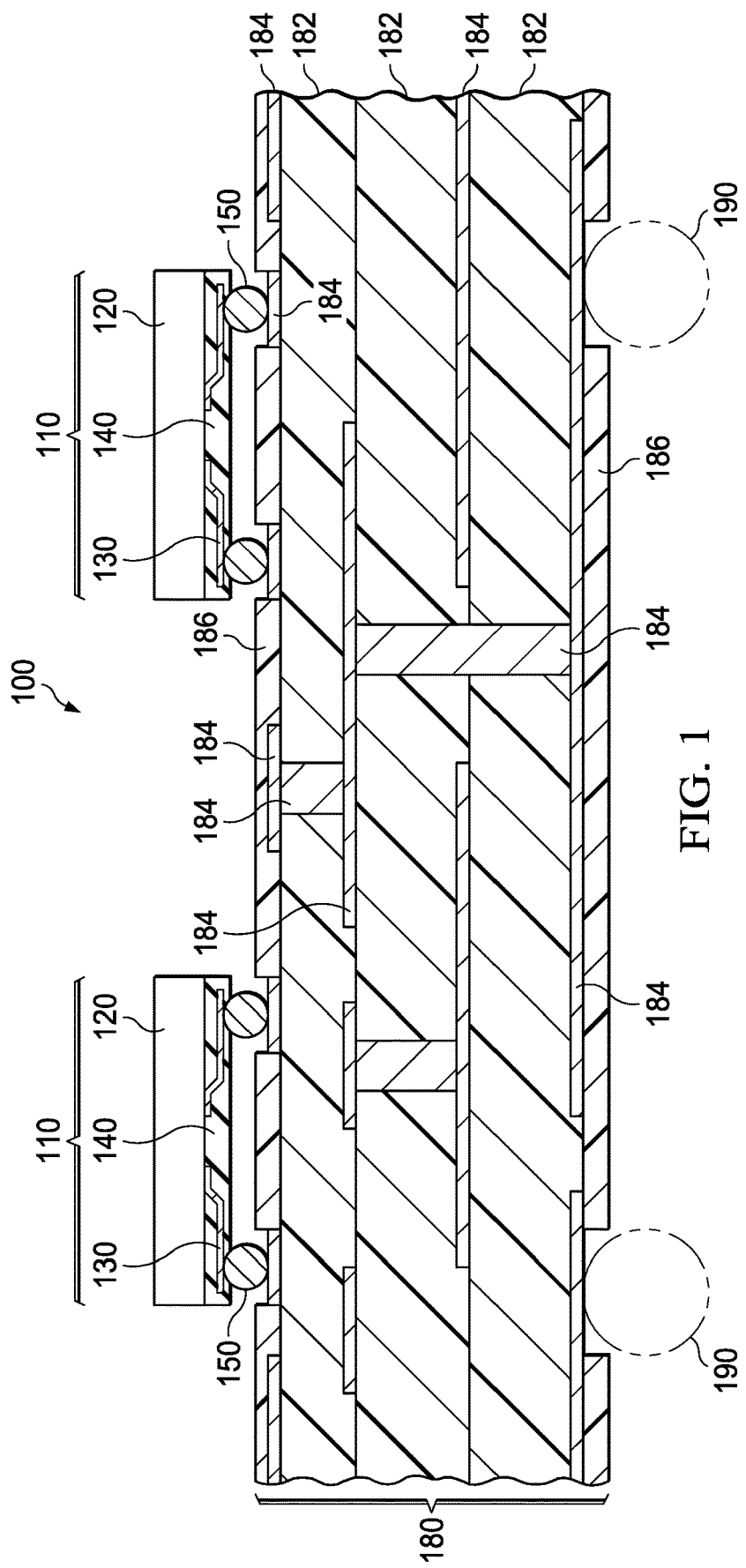
FIG. 1 is a schematic cross-section of an expansion compensated assembly in accordance with an embodiment of the present invention.

Referring now to FIG. 1, a schematic cross-section of an expansion compensated assembly 100 according to an embodiment of the present invention is shown. In this exemplary assembly 100, two expansion compensated packages 110 are attached to a higher-level interconnect 180 which may be, for example, a PCB, an organic ball grid array (BGA) package substrate, or a multi-chip-module (MCM) substrate.

Each of the expansion compensated packages 110 has a low-expansion substrate 120 which may be e.g. a silicon IC substrate in a chip-scale package. In some embodiments, substrate 120 may comprise a low-expansion interposer layer such as a silicon or glass interposer used within a multilayer package such as a 2.5D or 3D stacked system-in-package or chip-stack MCM package. A metal redistribution layer (RDL) 130 connects bond pads on the IC (not shown) to solder bumps 150, protected and insulated by one or more dielectric layers 140, which may e.g. be made of a polymer material. RDL 130 contains novel expansion compensating structures (not shown in FIG. 1), whose design and fabrication will be described later in more detail, as will detailed layer structures required to implement embodiments of the present invention. The expansion compensating structures are designed to move their associated solder bumps 150 in response to a temperature change in a direction and by a displacement amount that equals the motion of their mating pads on higher-level interconnect 180 due to the same temperature change. Since both sides of solder bumps 150 move by approximately the same amount, shear stresses in the solder bumps and their attachment structures due to the temperature change are minimized or eliminated.

Higher-level interconnect 180 may be constructed of insulating layers 182 made, e.g., of FR-4 or other high-CTE organic material, separating and insulating the conducting layers 184 that may be typically made of a metal such as copper (Cu). Conducting layers 184 may be interconnected by vertical vias (shown but not numbered), and the outermost conducting layers 184 may be protected and insulated by a solder mask layer 186, which may also be made of a polymer material. Expansion compensated packages 110 may be connected by melting their solder bumps 150 to a conducting layer 184 at exposed (i.e., not covered by solder mask 186) pads as shown. In some expansion compensated assemblies 100, optional solder balls 190 may be attached to an outer conducting layer 184 as shown at the bottom of the figure. Solder balls 190 would be used, for example, if the higher-level interconnect 180, instead of a PCB, is a substrate for a BGA package. Solder balls 190 may be attached to the opposite side (as shown) or to the same side of the higher-level interconnect 180 as the expansion compensated packages 110.

Although two expansion compensated packages 110 are shown in the example expansion compensated assembly 100 shown in FIG. 1, one, or more than two, packages 110 may be in an expansion compensated assembly 100, and not all have to be expansion compensated packages. For example, smaller IC packages or dice may not require expansion compensating structures. And although in the illustration of FIG. 1, the expansion compensated packages 110 are drawn to appear identical, they may have different design details; and an assembly 100 may include either different instances of the same packaged ICs (e.g., two identically designed chips) and/or different instances of different dice or ICs, e.g. having different functions, or manufactured using different process technologies, or perhaps even having different material substrates.

Figure 2:
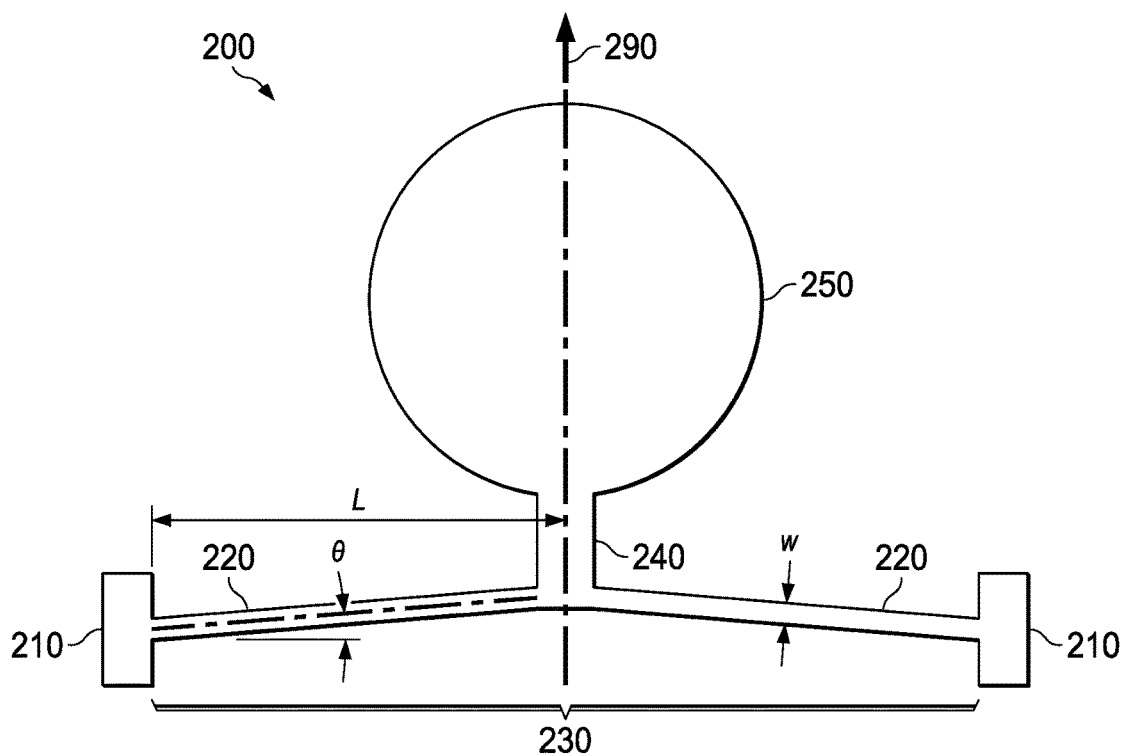
FIG. 2 is a schematic plan view or mask layout showing one layer of an expansion compensating structure in accordance with an embodiment of the present invention.

Referring now to FIG. 2, a schematic plan view showing one layer of an expansion compensating structure 200 according to the present invention, exhibiting key features illustrating the basic principles of operation. The layer shown corresponds to the redistribution layer (RDL) of an expansion compensated package 110, which is typically made of copper (Cu) or other metal having a relatively high CTE compared to that of the low-expansion substrate 120 (not shown in FIG. 2) upon which structure 200 is constructed. The RDL layer is substantially parallel to the surface of low-expansion substrate 120, and may be constructed on substrate 120 using microelectronic fabrication techniques such as photolithography, deposition and etching used in IC and package processing flows. In this RDL layer, an actuator 230 capable of moving bump pad portion 250 is formed. In an exemplary embodiment, actuator 230 comprises a micromechanical (MEMS) linear actuator capable of displacing bump pad 250 from an initial position (shown) in the direction shown by arrow 290 as the temperature of the structure increases above an initial temperature. In this embodiment, the linear actuator 230 may be constructed using a bent-beam flexure structure referred to as a "chevron-type" actuator, called so because the two beams 220 are angled symmetrically in a shallow V-shape about the center line of the structure (indicated by the dash-dot line parallel to direction 290) as shown. The outer ends of beams 220 away from the center line are rigidly connected to the low-CTE substrate 120 at anchor positions indicated by anchor portions 210 in the RDL layer. Details of the other layers in an anchor structure will be described later.

The chevron-type actuator 230 operates by thermal expansion, and exhibits a motion-amplifying characteristic in that the elongation of beams 220 due to thermal expansion is smaller than the displacement of bump pad 250 in direction 290 that can be achieved by the same change in temperature. Specifically, each beam has a length L from an anchor portion 210 to the centerline of bump pad 250, and each is slanted at a relatively small bend angle theta ($\theta$) with respect to the horizontal in the figure, as also illustrated in FIG. 2. An increase in temperature results in an increase in beam length L due to thermal expansion, and a displacement "upward" in the diagram along 290 due to actuator 230. For the same temperature increase, a greater displacement occurs (i.e., greater motion amplification) for longer beam length L and for smaller bend angle $\theta$. Unloaded displacement of the bump pad 250 is relatively independent of beam width w; beam width has more effect on the force with which the actuator moves the pump pad against surrounding constraints such as dielectric layers, since the force is approximately proportional to the cross sectional area (width×thickness) of the beams 220.

Figure 3:
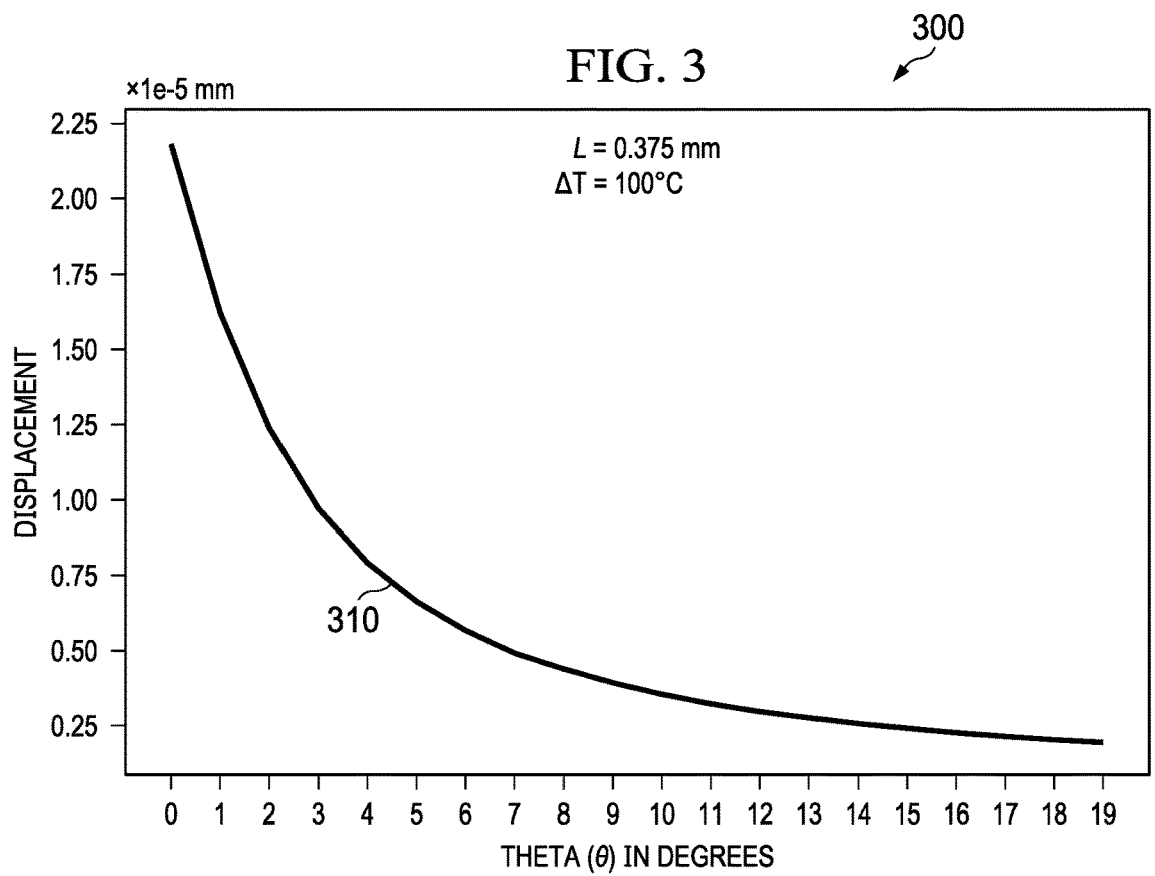
FIG. 3 is a graph showing a simulated curve of displacement vs beam bend angle for an expansion compensating structure designed in accordance with one embodiment of the present invention.

In FIG. 3, a graph 300 of a simulated displacement vs. initial beam bend angle theta ($\theta$) in degrees is presented for some representative practical dimensions and using copper (CTE=17 ppm/° C.) as the RDL material. It can be seen from displacement curve 310 how sensitive the motion amplification behavior of a chevron actuator is to beam bend angle $\theta$, particularly for small angles, at which the slope of the motion amplification ("gain") curve 310 increases. The displacement axis is in units of tens of micrometers (µall), and for a beam bend angle $\theta$ of three degrees (3°), and a beam length of 0.375 mm (375 µm), it can be seen that a displacement on the order of ten micrometers (10 µm) can be achieved for a temperature rise of 100 degrees Celsius (100° C.). This model calculation makes some simplifying assumptions such as not accounting for the expansion of the low-expansion substrate 120 (i.e. assuming a fixed position for the anchors 210), but is correct to first order to display the overall nonlinearity of curve 310.

Referring again to FIG. 2, beams 220 are shown acting on an optional handle portion 240 instead of directly upon bump pad 250, so as to achieve a larger effective length L than can be achieved by connecting to a wider part of bump pad 250, and hence a greater displacement as a function of temperature for the same overall width of expansion compensating structure 200. This structure can allow the placement of such structures 200 on a finer bump pad pitch. Note also that although bump pad 250 is shown as approximately circular, this is not required, and any bump pad shape such as a square or other polygon is possible. Bump pad 250 may not be used to attach a solder bump, but could be used for another type of attachment to higher-level interconnect 180, including a solder bump attached directly to interconnect 180, or conductive adhesive, or a direct metal bond. However, since solder bumps are typically attached to a WLCSP, and are approximately spherical, other layers (to be described later) may have circular features that serve to guide the formation of a round solder bump on bump pad 250.

In use, expansion compensating structures 200 will be designed so as to move each respective bump pad 250 by a displacement that matches the motion of a mating pad on a higher-level interconnect 180. To accomplish this, actuator 230 need not be of the chevron type, but may be of any type that produces approximately linear motion having sufficient displacement to compensate for the displacement of the mating pad on the higher-level interconnect 180. Further, the linear actuator 230 need not produce an exactly straight-line motion, but may move bump pad 250 along a curve that closely approximates a straight line, so that it experiences a relatively small orthogonal motion to displacement direction 290. Also, sufficient displacement is preferably achieved by actuator 230 to accommodate and compensate expansion of higher-level interconnect 180 over the entire operating temperature range. However, the exact function of displacement vs. temperature due to actuator 230 need not exactly match the nonlinear thermal expansion properties of the higher-level interconnect 180, since higher-order terms above the linear coefficient of thermal expansion are relatively small for most materials. Nevertheless, careful design of actuator 230 and the entire structure is warranted, since the closer the displacement of bump pad 250 is to the motion of its mating location on higher-level interconnect 180, the smaller shear stresses will be in and around solder bumps 150.

Figure 4A:
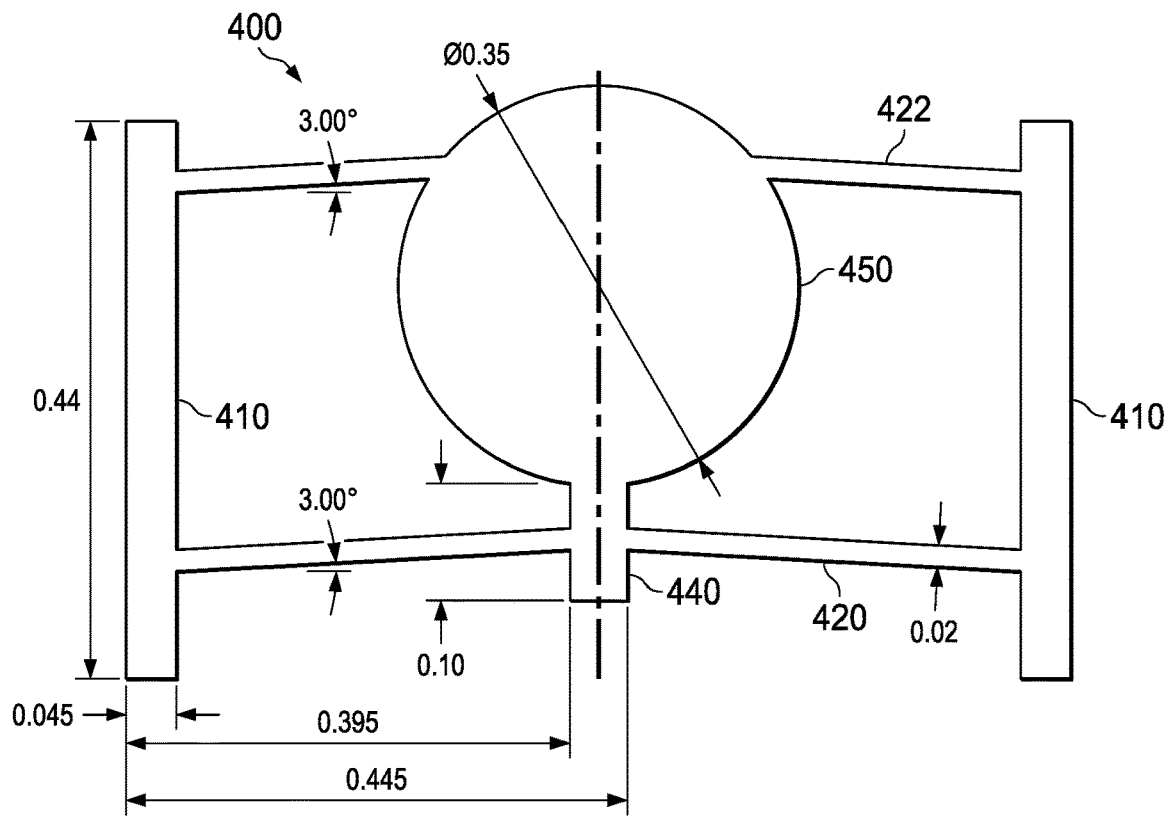
FIG. 4A is a schematic plan view or mask layout showing one layer of an expansion compensating structure in accordance with an embodiment of the present invention.

Referring now to FIG. 4A, a schematic plan view of mask layout view of the RDL layer in an exemplary alternative embodiment for an expansion compensating structure 400 is shown. In this embodiment, a four-beam chevron-type actuator is illustrated that has a pair of lower beams 420 bridging between anchor portions 410 and handle portion 440, and upper beams 422 bridging between anchor portions 410 and bump pad 450. The additional support of upper beams 422 (which were absent in the expansion compensating structure 200 as shown in FIG. 2) provides additional symmetry and support for bump pad portion 450, helping to constrain its motion to the plane of the actuators, and permits additional tailoring of the displacement vs. temperature response of the actuators. The expansion compensating structure 400 is symmetrical about the vertical axis. Exemplary dimensions (in mm) used for a finite element analysis (FEA) simulation are indicated in FIG. 4A, in which the structures are drawn to scale. Beam length L of lower beams 420 is 0.375 mm. All beams have a bend angle of 3.00 degrees, and are 0.02 mm wide. Anchors are 0.045 mm wide and 0.44 mm long to support both upper and lower sets of beams 422 and 420, respectively. The handle portion 440 is drawn as 0.10 mm long.

Figure 4B:
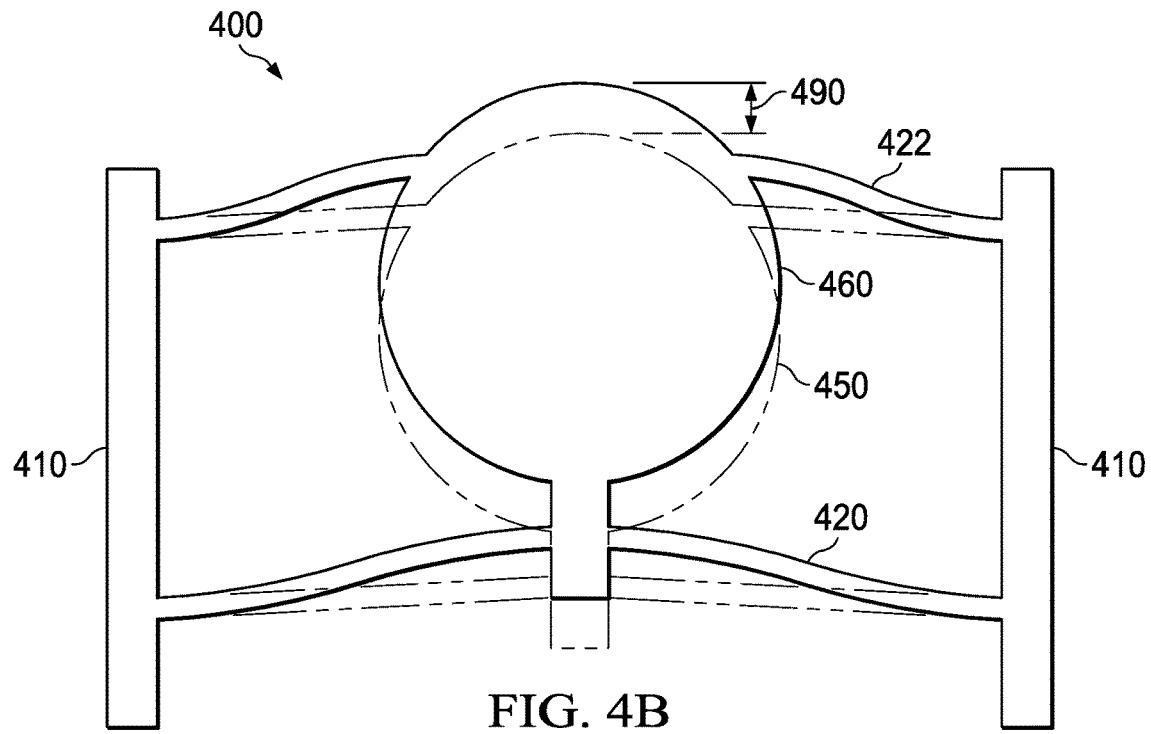
FIG. 4B is a schematic plan view of the expansion compensating structure of FIG. 4A showing displacement caused by an increase in temperature.

FIG. 4B is a schematic plan view of the same expansion compensating structure 400, with the same dimensions as in FIG. 4A, but at a temperature 100 degrees Celsius (100° C.) higher, showing the change in shape calculated using a finite element analysis (FEA). Bump pad 450 (shown in its undeflected position) has moved to its displaced (deflected) bump pad position 460 by a distance indicated by displacement amount 490. The amount of displacement has been magnified in this dimension by approximately a factor of 10 in the drawing in order to make the change in shape more obvious.

Figure 5:
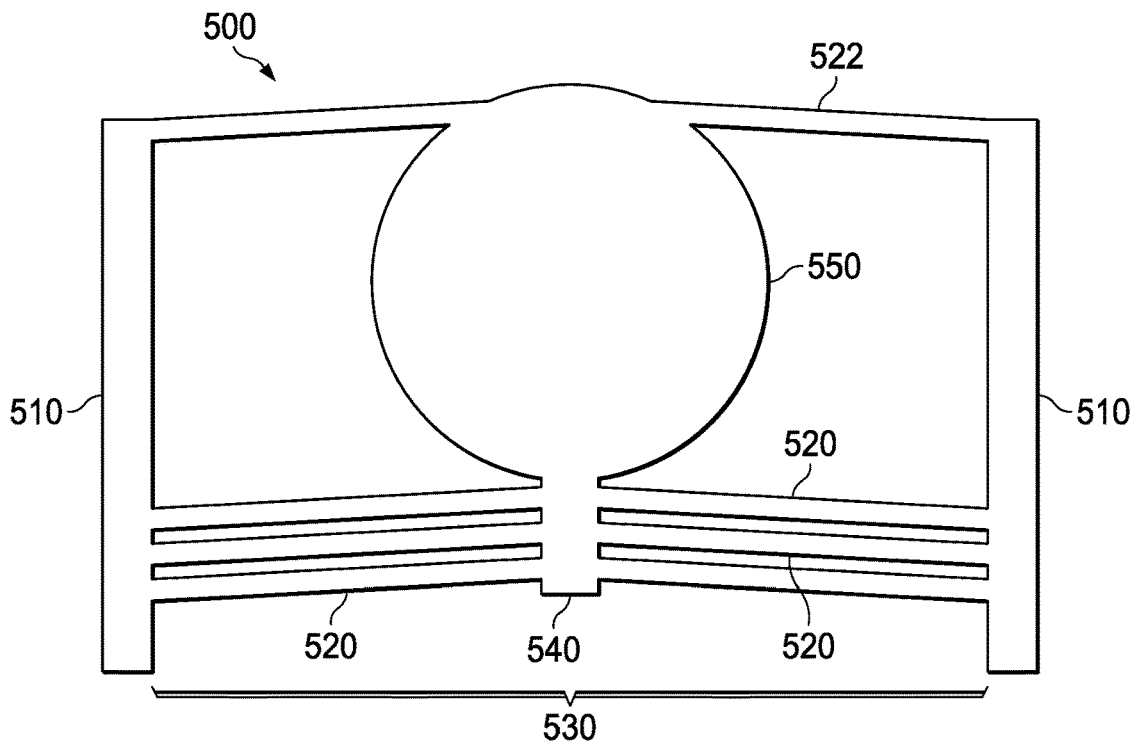
FIG. 5 is a schematic plan view or mask layout showing one layer of an expansion compensating structure in accordance with another embodiment of the present invention.

Referring next to FIG. 5, a schematic plan view or mask layout of the RDL mask layer is shown for another embodiment of an expansion compensating structure 500. In this embodiment, a chevron-type actuator 530 is shown that has multiple parallel lower beams 520 (in the illustrated design, three sets of parallel chevrons) attached between anchor portions 510 and handle portion 540, and one set of upper beams 522 as in the previous designs shown in FIGS. 4A and 4B attached between anchor portions 510 and bump pad 550. Using more parallel beams does not increase the displacement, but rather the total force that the actuator 530 can apply to move the bump pad 550. Additional parallel upper beams 522 could also be used. Increasing the number of beams, while having little effect on the movement, does have significant impact on fatigue failure reliability, and can provide some redundancy. More parallel beams also add increased thermal and electrical conductivity. Increasing the number of beams 520 and 522 and designing them to tailor their properties, e.g. by varying their lengths L and/or bend angles θ along the vertical dimension of the structure, also increases the number of design variables that can be used to optimize the motion of the bump pad. For example, varying beam lengths can be used to accommodate the thermal expansion of the RDL in the direction along the handle and bump pad. Optimized beam shapes designed with the aid of finite element analysis may not have constant width w, but might be tailored based on thermal conductivity and buckling conditions to simultaneously optimize displacement, heat transfer and fatigue reliability.

Figure 6:
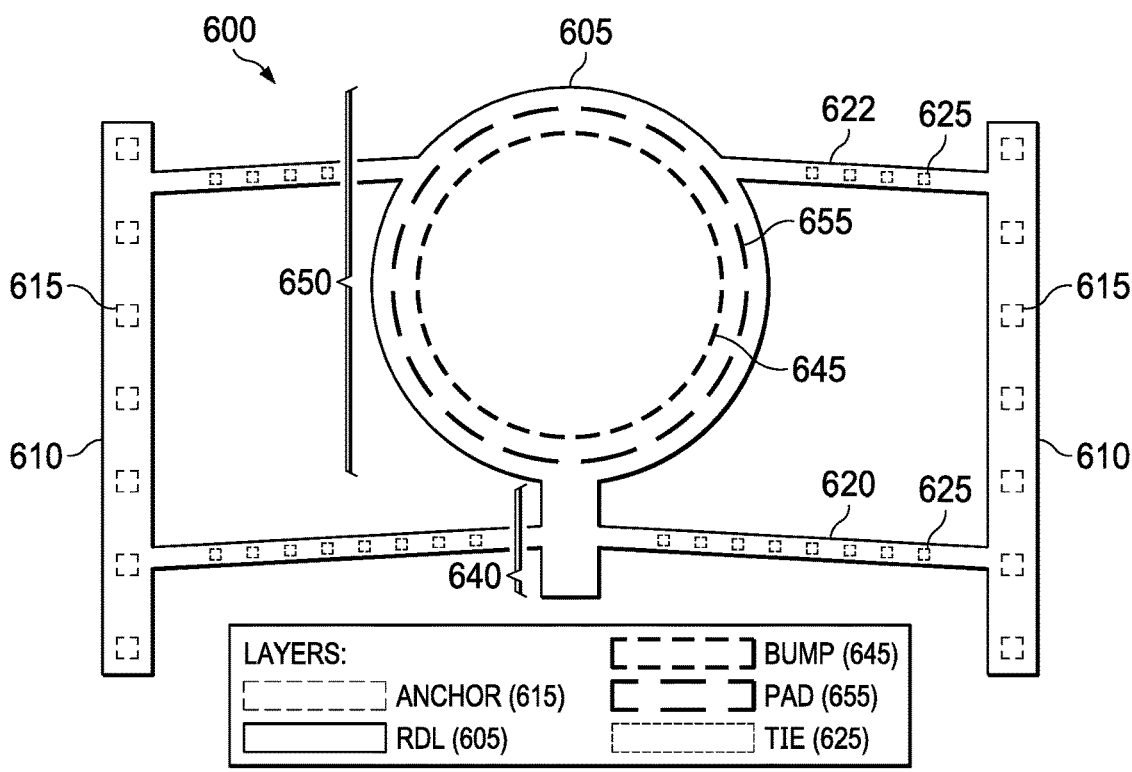
FIG. 6 is a schematic plan view or mask layout showing several mask layers for an expansion compensating structure in accordance with an embodiment of the present invention.

Referring now to FIG. 6, a schematic plan view showing layouts of several mask layers that can be used in fabricating a complete expansion compensating structure 600, having four beams 620 and 622 and shaped similarly to those of FIGS. 4A and 4B is shown. FIG. 6 shows the patterns on several mask layers and how they may be sized, positioned, and registered for an exemplary embodiment. This plan view will also be used in the discussion of the cross-sections in FIGS. 7A-7C. The outline of the mask used to pattern the RDL (redistribution layer) is labeled 605 (RDL). As before, this pattern includes anchor portions 610, lower beams 620, upper beams 622, a handle portion 640, and a bump pad portion 650. The RDL 605 is anchored to the underlying IC through anchor vias 615 shown as small squares in layer 615 (ANCHOR). As will be seen in the cross sections, additional mask layers 645 (BUMP) and 655 (PAD) are used to create a suitable under bump metallization (UBM) structure to which a solder bump can be attached. As will be seen later, in some embodiments, optional layer 625 (TIE) is used to form small tie vias that connect two or more RDL layers for some types of multi-layer actuators.

Figure 7A:
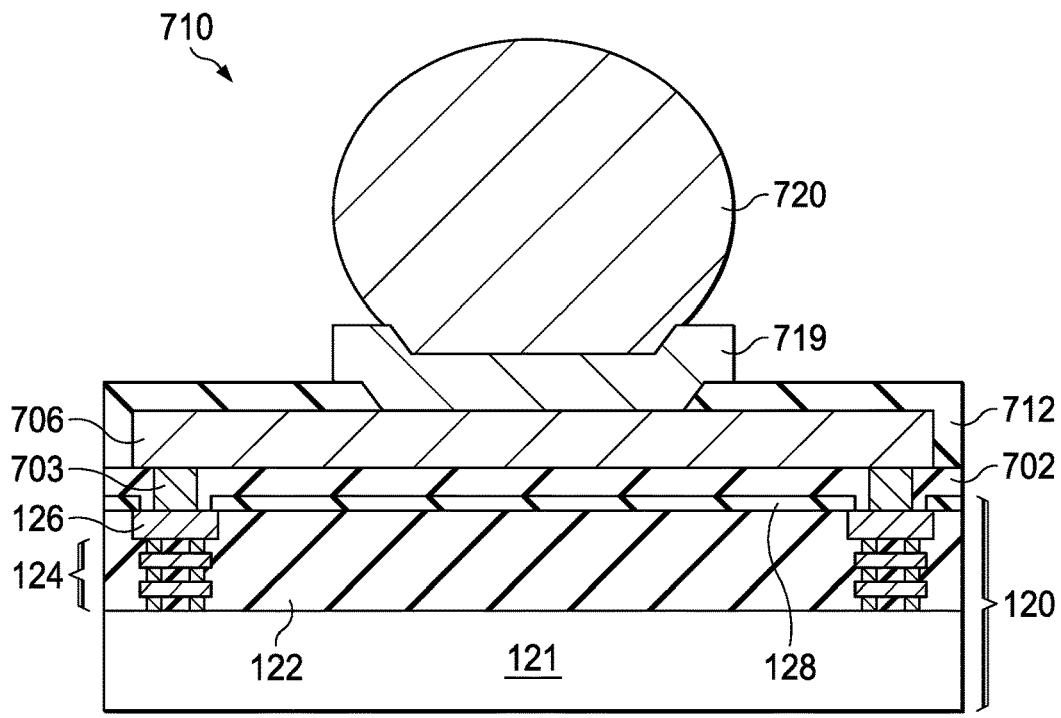
FIG. 7A is a schematic cross-section of an expansion compensated IC package in accordance with an embodiment of the present invention.

A schematic cross-section of a portion of an expansion compensated IC package 710 using a single redistribution layer 706, as in previous embodiments that have been described, is shown in FIG. 7A. This portion shows a cross-section through a part of an expansion compensated structure 600 as shown in plan or layout view in FIG. 6. This embodiment illustrates a wafer-level chip-scale package (WLCSP) in which the low-expansion substrate 120 consists of an IC die, and the expansion compensating structure layers are formed on the surface of the IC die using a polymer dielectric RDL wafer-level packaging process. Such an expansion compensated WLCSP 710 also includes a solder bump 720 attached to the package 710 using compatible under bump metallization 719. This cross-section explains how the expansion compensated structure 600 is attached to the IC die 120 in more detail. IC die 120 has a (typically Si) low-expansion IC substrate 121, and interconnect structures including interconnect dielectric layers (represented schematically in FIGS. 7A-7C as a single layer 122) and metal interconnect layers, consisting of lower level metal interconnect layers 124 (shown as having traces and interlayer vias). The top level metal interconnect 126 contains bond pads for connection of the IC to external circuitry. Over the top level metal 126 is a passivation layer 128, which is typically a silicon nitride or oxynitride material that is relatively thick to protect the surface of the IC from contamination and damage during further processing, handling, and packaging. Bond pads in the top level metal 126 are exposed by openings in passivation 128 so that electrical contacts can be established.

Other layers associated with the present invention are also shown in FIG. 7A, and correspond with the mask layout of FIG. 6 as follows. Anchor vias 703 are formed by using mask layer 615 (ANCHOR) and patterning steps to create via openings in a first dielectric layer 702, which is typically a spun-on polymer dielectric material such as polyimide (PI) or benzocyclobutene (BCB). RDL metal is deposited to form redistribution layer 706, which contains the structures shown in mask layer 605 in FIG. 6. This metal may be deposited and etched, or more commonly, built up in openings in the first dielectric 702 by using an electroplating process. Then a second dielectric layer 712 is coated over RDL 706, and an opening in it patterned using mask 645 (BUMP) to create a bump via. Second or later dielectric layers such as 712 can act as a solder mask during bumping. A pad for solder bump 720 is made by depositing a suitable series of metals called an under bump metallization (UBM), and then patterning it to form the UBM pad 719, using mask 655 (PAD). It can be seen that typically the bump via pattern 645 (BUMP) is smaller than the extent of the bump pad 650 in the RDL layer 706 (patterned by mask 605 RDL), while the pad 719, formed by mask 655 (PAD), extends larger than bump via formed by pattern 645 (BUMP). These design rules are simply to guarantee that full patterns are created even in the presence of misalignments, so that these overlaps are easy and inexpensive to fabricate. Note that although the circular pad layer 655 (PAD) is shown smaller than bump pad 650 in the RDL layer in FIG. 6, in practice the design rules are satisfied whether pad 655 (also shown as the lateral extent of UBM 719 in FIGS. 7A-7C) is smaller or larger than the bump pad area 650 in the RDL. The UBM layer(s) in UBM pad 719 add thickness over the bump pad, so they may provide some resistance to out-of-plane buckling for the bump pad area.

Figure 7B:
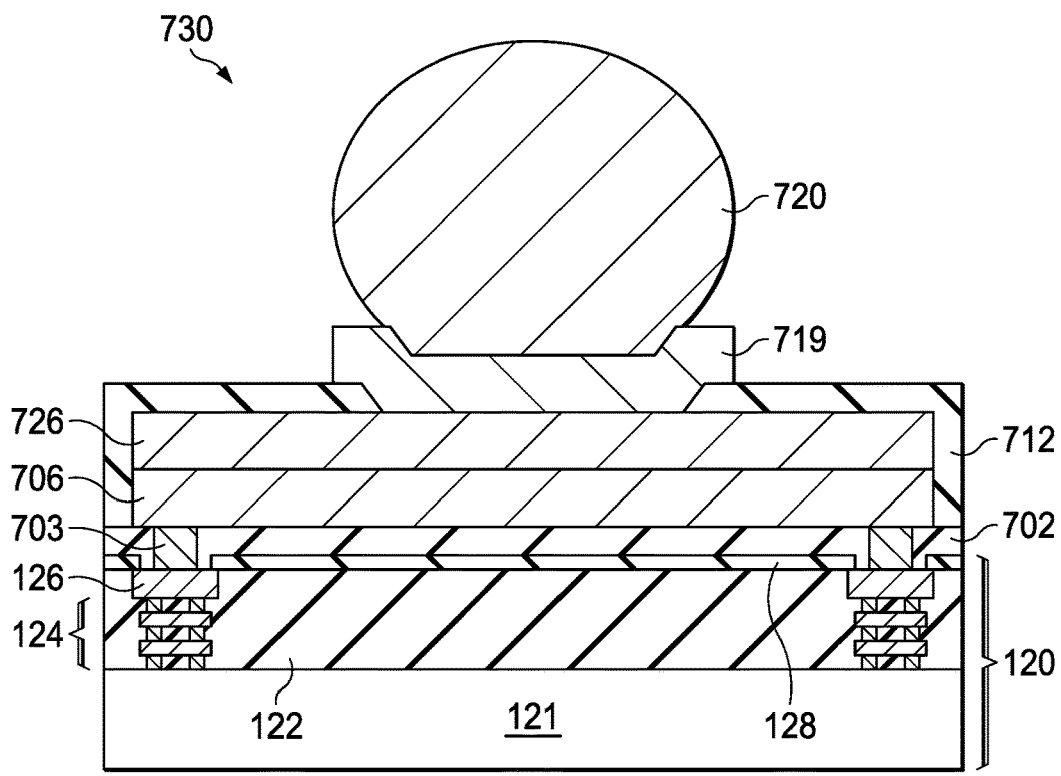
FIG. 7B is a schematic cross-section of an expansion compensated IC package in accordance with another embodiment of the present invention.

FIG. 7B shows a schematic cross-section of a portion of an expansion compensated IC package 730 for a different embodiment of an actuator that uses two redistribution layers: a first redistribution layer 706, as in FIG. 7A, and a second redistribution layer 726 fabricated generally on top of first redistribution layer 706 and having a similar mask layout in the actuator and possibly bump pad portions to those in first redistribution layer 706. The purpose of doubling up the thickness of the RDL is to provide additional stiffness to out-of-plane buckling in the actuators and associated expansion compensating structures. More than two layers could be used if necessary to further increase the stiffness out of the plane. Another variation in some embodiments would be to form a bump pad portion on the first redistribution layer 706, to which UBM 719 and solder bump 720 could be attached instead of attaching UBM to second redistribution layer 726, if the additional thickness of RDL is only needed in the actuator areas and not in the bump pad areas.

Figure 7C:
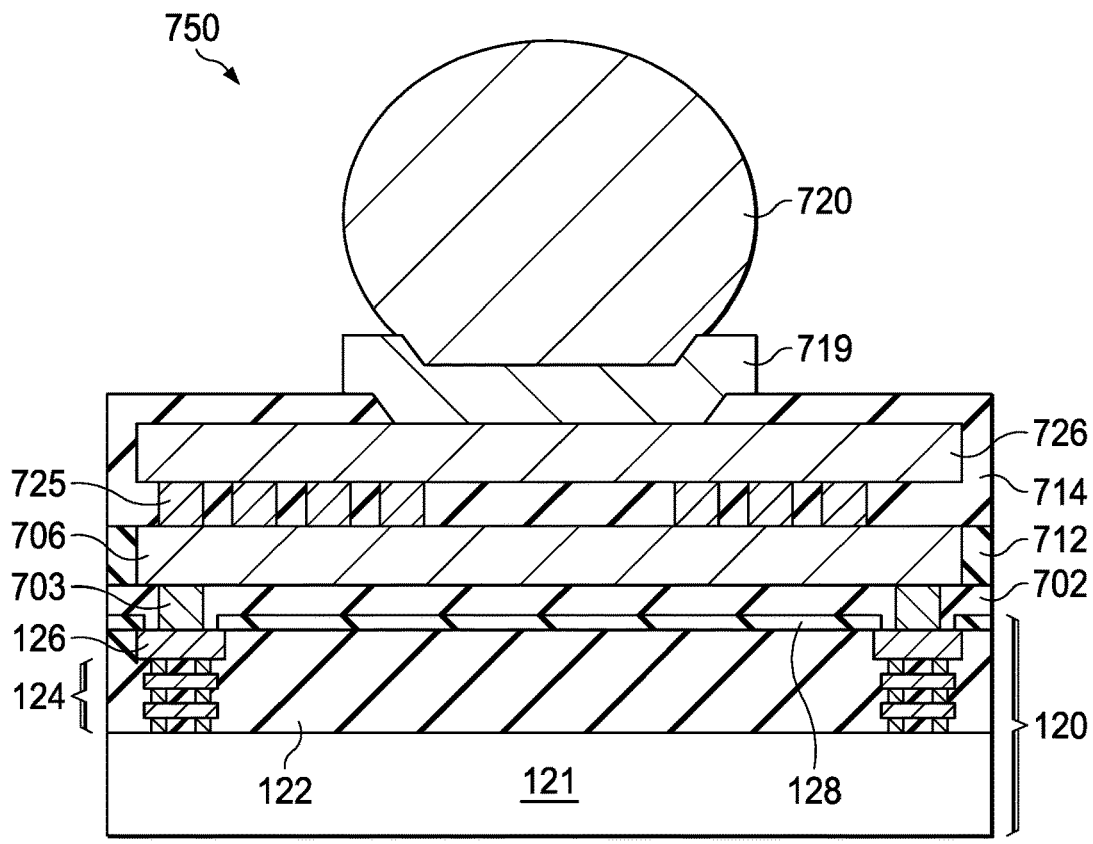
FIG. 7C is a schematic cross-section of an expansion compensated IC package in accordance with yet another embodiment of the present invention.

Referring now to FIG. 7C, a schematic cross-section of portion of an expansion compensated IC package 750 for another embodiment of an actuator that uses two redistribution layers is shown. In this embodiment, tie vias 725, that are formed using mask layer 625 (TIE) as shown in FIG. 6, are used to connect first RDL 706 and second RDL 726, rather than to overlay second RDL layer 726 directly onto first RDL layer 706. This structure achieves a thicker vertical dimension (greater than two RDL thicknesses) for greater out-of-plane stiffness, using a similar process to the formation of anchor vias 703. Thus, this process should also be available with little modification to commercial RDL processes. A third and final dielectric layer 714 may be used in the formation of these vias and to encapsulate the second RDL layer 726 before forming UBM pads 719 as before.

Figure 8:
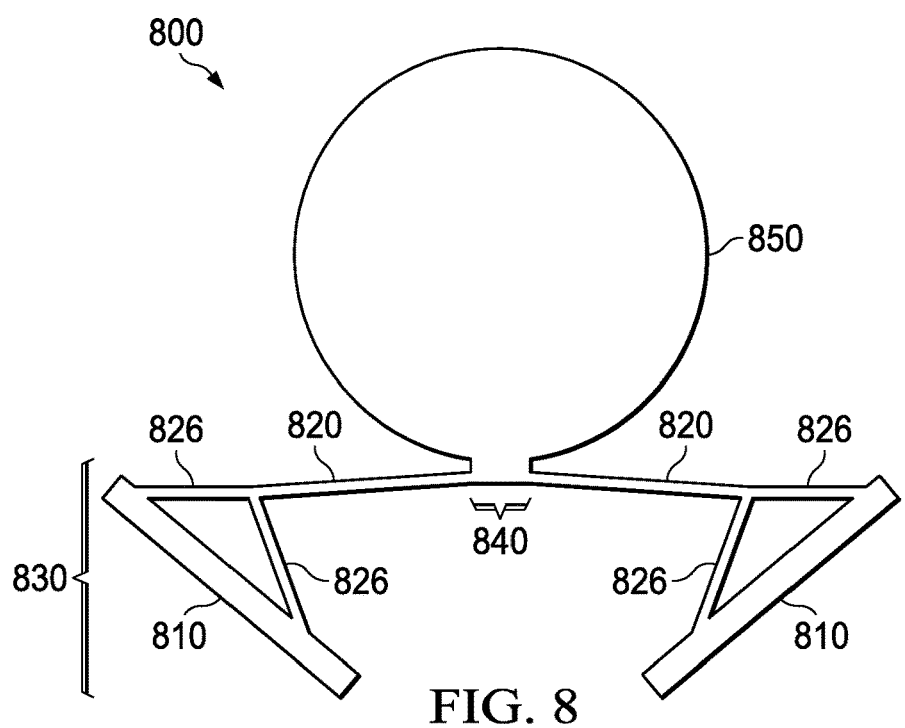
FIG. 8 is a schematic plan view or mask layout showing one layer of an expansion compensating structure in accordance with another embodiment of the present invention.
Figure 9:
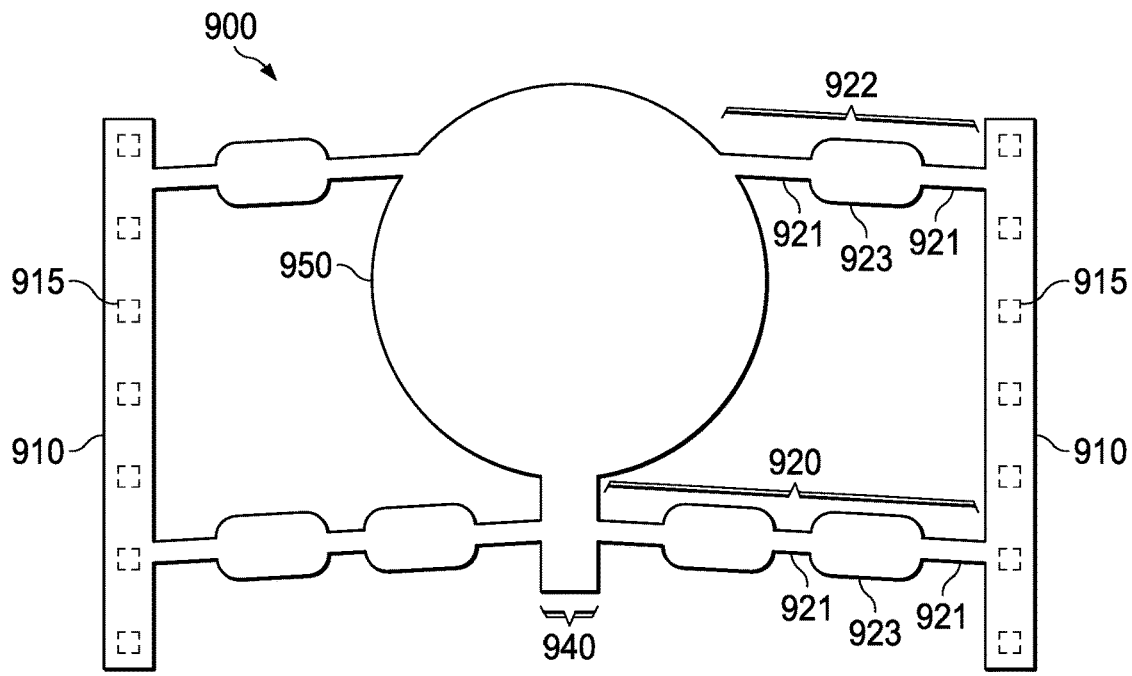
FIG. 9 is a schematic plan view or mask layout showing one layer of an expansion compensating structure in accordance with another embodiment of the present invention.
Figure 10:
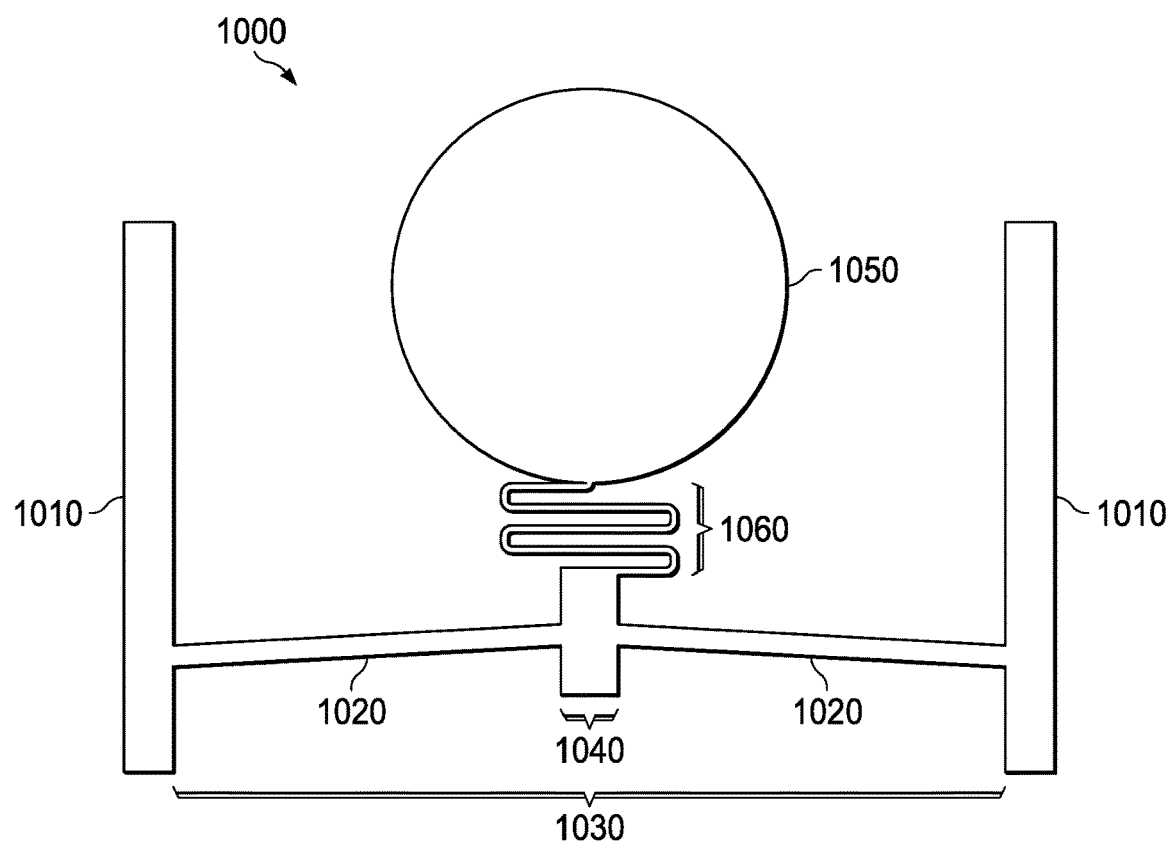
FIG. 10 is a schematic plan view or mask layout showing one layer of an expansion compensating structure in accordance with yet another embodiment of the present invention.

Further variations of expansion compensating structures are shown in FIGS. 8-10. FIG. 8 is a plan view of a mask layout for the RDL layer, illustrating another embodiment of an expansion compensating structure 800 that makes use of cascaded chevron actuators 830 for further motion amplification to achieve larger displacements for a given temperature change. Primary sets of beams 820 attached to bump pad 850 portion through optional handle portion 840 are not connected directly to anchor portions 810, but instead are driven by pairs of secondary beams 826 that are attached to anchor portions 810. This arrangement achieves further motion amplification and thus significantly larger displacements than simple chevron structures, since the effective anchor points for the primary beams 820 are not fixed, but actually driven inward by the secondary actuator pairs of beams 826. A tendency for out-of-plane buckling in such a structure can be mitigated by using the thicker multiple RDL structures of FIG. 7B or 7C.

In FIG. 9, a plan view or mask layout of an embodiment of an expansion compensating structure 900 is shown in which the lower beam 920 and upper beam 922 have wide sections 923 separated by narrow sections 921. (Not all sections are labeled and the symmetry, as in other figures, is to be understood.) Narrow sections 921 are more flexible in the plane and thus reduce stresses in flexure, e.g. near attachment points next to anchor portions 910, at the handle portion 940, or next to bump pad 950 in the case of upper beams 922. Multiple narrow and wide sections as shown in lower beams 920 may increase effective beam flexibility in the plane while maintaining available force from the actuator. Again, anchor portions 910 in the RDL layer shown may be formed with anchor vias 915 to connect to the IC or other low-expansion substrate 120 (not shown in FIG. 9). Should a multilayer RDL structure be used that has tie vias (625 in FIG. 6 or 725 as in FIG. 7C), such tie vias may preferably be formed and placed in wide sections 923 of beams 920 and 922 for ease of alignment.

Referring now to FIG. 10, a plan view of an RDL layer layout for an embodiment of an expansion compensating structure 1000 is shown in which an additional compliant link 1060 is connected between actuator 1030 and bump pad portion 1050. As in other embodiments, a chevron-type actuator with beams 1020 connecting anchor portions 1010 to an optional handle portion 1040 is used to provide a calibrated temperature-dependent displacement of the bump pad 1050. A solder bump connected to bump pad 1050 as well as to a higher-CTE higher-level interconnect such as a PCB will tend to pull bump pad 1050 in the same direction as the actuator is pushing it. Thus, if the motion due to the actuator 1030 is perfect, compliant link 1060 will remain the same length and undeflected. However, if there is a small error in the displacement that does not quite compensate for the expansion of the PCB, the compliant link can be stretched or compressed in the plane to take up the remaining displacement error. Such a compliant feature 1060 can be used to reduce the number of different designs required for individual expansion compensating structures in an expansion compensated package (see below), or could also help reduce out-of-plane stresses that can be caused by substrate warpage or actuator buckling.

Figure 11A:
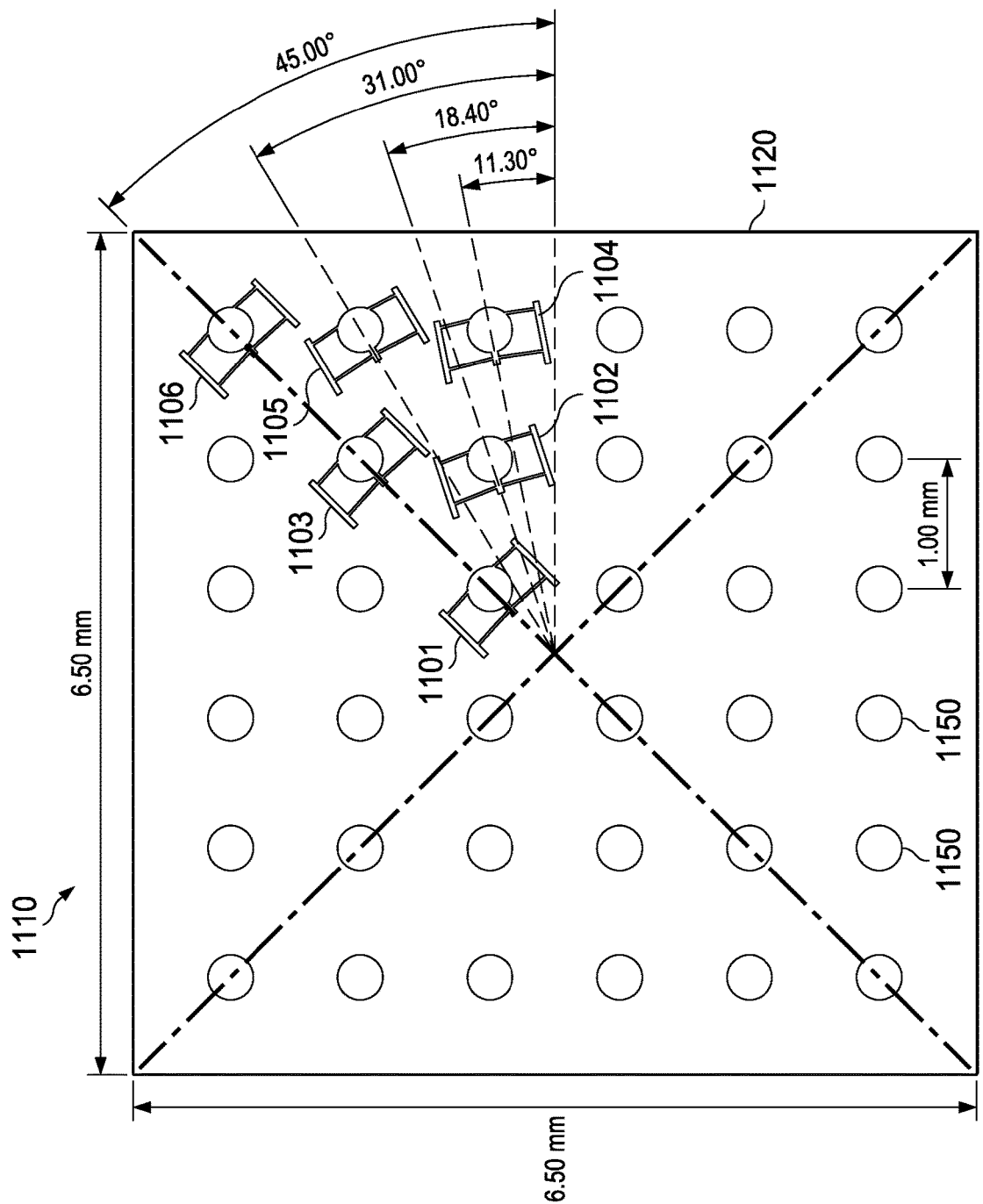
FIG. 11A is a schematic plan view of an expansion compensated IC package in accordance with one embodiment of the present invention.
Figure 11B:
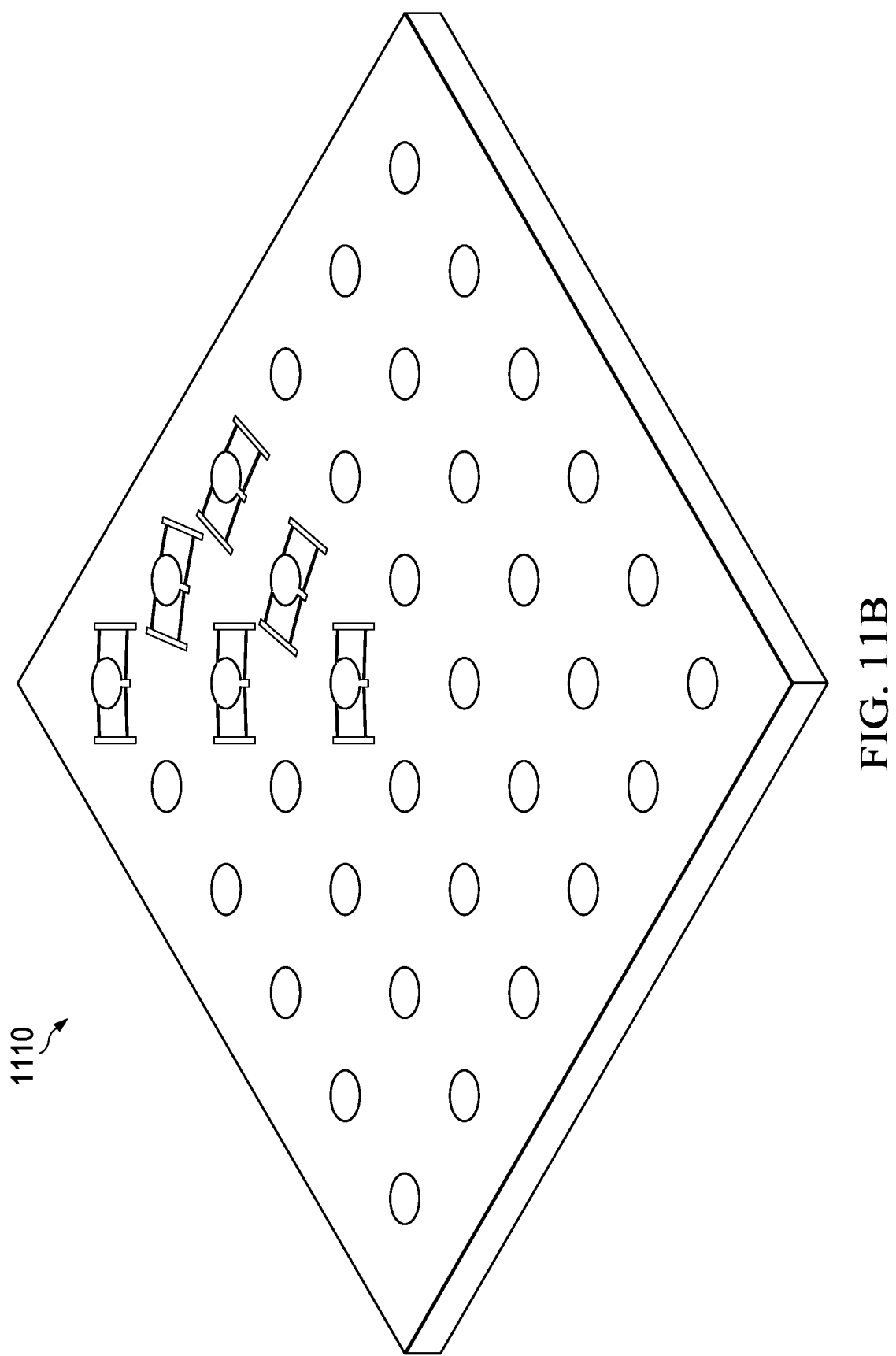
FIG. 11B is an isometric view of the expansion compensated IC package shown in FIG. 11A.

FIGS. 11A and 11B are two views of an expansion compensated IC package 1110 such as a WLCSP according to the present invention, with exemplary dimensions notated directly on FIG. 11A. In this example, a large WLCSP is built using an IC having a square die 1120 of size 6.50 mm×6.50 mm and 36 solder bump positions 1150 in a square array with 1.00 mm×1.00 mm pitch (center-to-center spacing). The center of the square die defines the neutral point, from which distance to neutral point (DNP) is measured and expansion is experienced. Six unique designs for expansion compensating structures can be used to exactly compensate the radial expansion at each solder bump; all other bumps can use one of these six designs due to symmetry. Thus, only six expansion compensating structures are drawn and labeled, with reference numerals 1101, 1102, 1103, 1104, 1105, and 1106, requiring four different rotation angles about the neutral point, which can be seen in FIG. 11A to be at approximately 11.30, 18.40, 31.00, and 45.00 degrees (and their corresponding 8-fold symmetry angles). Each expansion compensating structure is placed so as to position its bump pad in an undeflected state centered on the square array grid points; and each is oriented such the direction of actuation of the bump pads is radially outward from the neutral point with increasing temperature. Thus, the solder bumps attached to the bump pads move as if they were attached to a substrate having a higher CTE, and when attached to a higher-level interconnect with a larger CTE at connection locations coinciding with the grid points, the stresses are reduced at each connection location by the action of the micromechanical actuators. Minimizing stress requires designing each expansion compensating structure to have a displacement at a given temperature that is proportional to the DNP for its radial position. FIG. 11B is an isometric view of the same expansion compensated IC package 1110 shown in FIG. 11A.

In some embodiments, an expansion compensated package may use expansion compensating structures only for some of the bump pads, e.g. those at the largest DNP. In some packages, a heat dissipation pad may be placed at the center of the package (at largest DNP) so that micromechanically-actuated bump pads may not be needed in that area. For larger packages that would require many different unique designs, or to cover many more package sizes, thus requiring many more than six unique designs, radial zones having the same expansion compensating structure might be used to reduce the number of different designs. That is, one actuator design might be used to cover a range of strains caused by differences in expansion. And the embodiment of a structure incorporating a compliant link as illustrated in FIG. 10 might also be used to help cover a range of strains, or for more adaptability to nonidealities such as warpage.

Figure 12A:
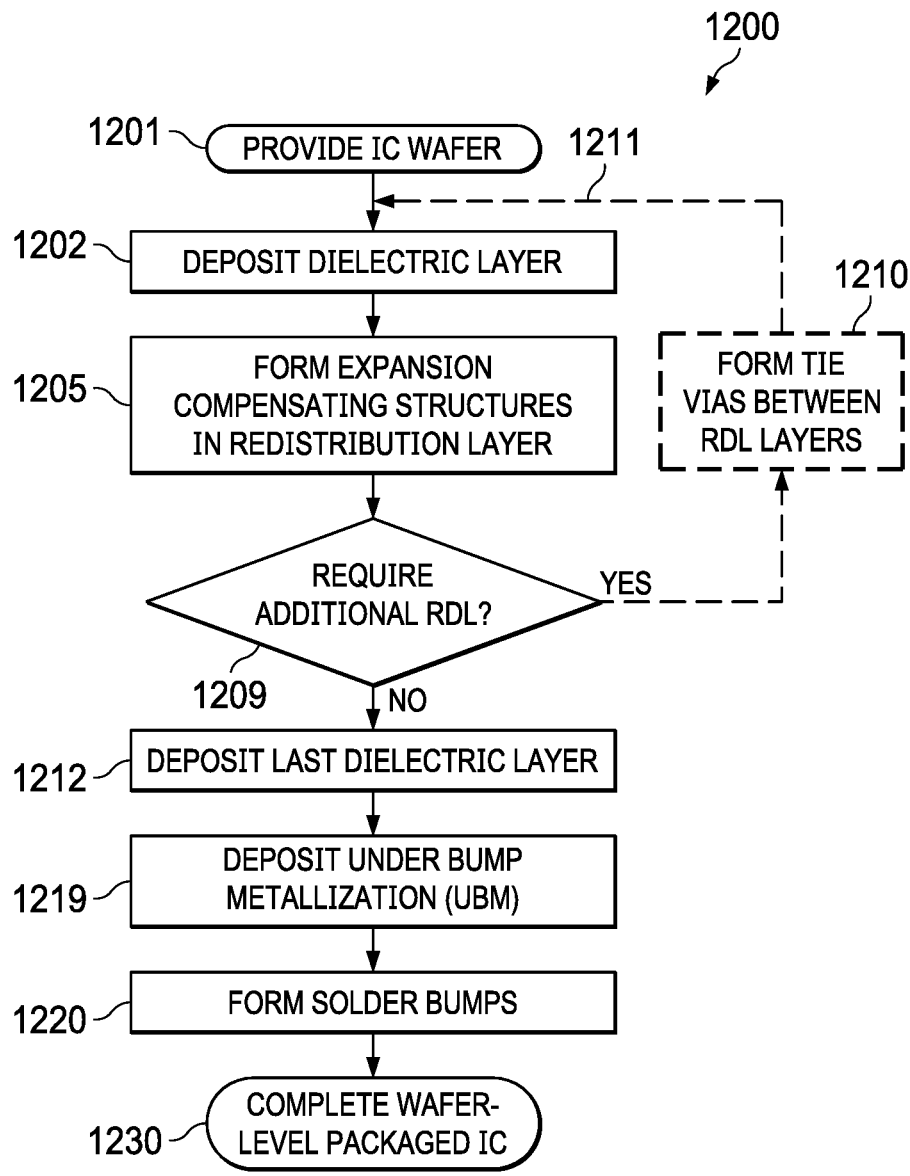
FIG. 12A is a flow chart depicting a method for fabricating an expansion compensated IC package according to an embodiment of the present invention.
Figure 12B:
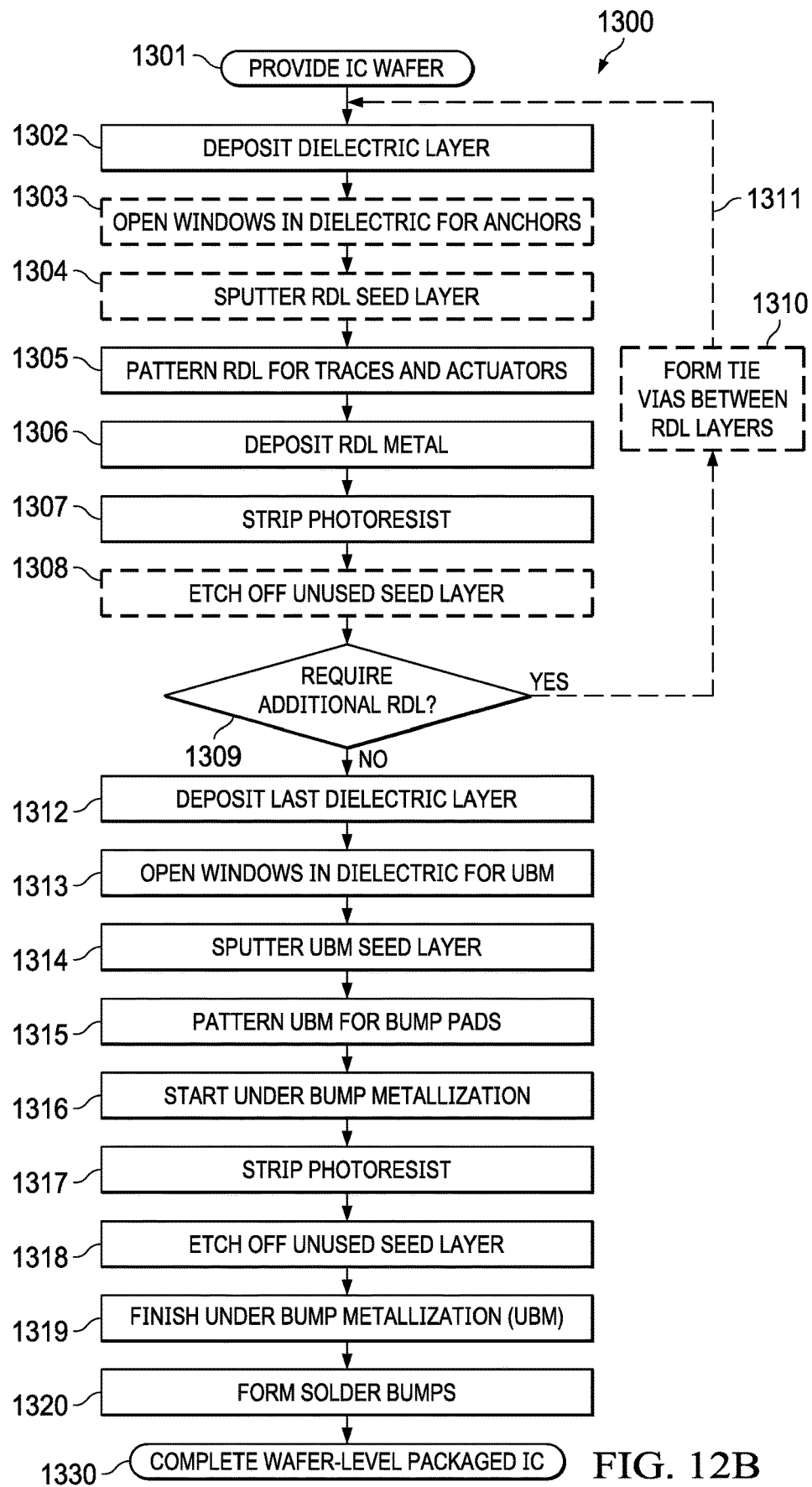
FIG. 12B is a more detailed flow chart depicting a method for fabricating an expansion compensated IC package according to an embodiment of the present invention.

FIGS. 12A and 12B present flow charts of methods to fabricate expansion compensated packages (and the expansion compensating structures therein) that can result in devices having cross-sections as in FIGS. 7A-7C. Referring now to FIG. 12A, a simplified flow chart describing an embodiment of an overall basic process flow 1200 for fabricating a WLCSP having expansion compensating structures is shown. An IC wafer is provided to start at step 1201. Next a dielectric layer is deposited in step 1202, e.g. by spinning on a polymer dielectric. In step 1205, expansion compensating structures are formed in a redistribution layer (RDL) on the dielectric layer; various methods of patterning the dielectric layer, and depositing and patterning the redistribution layer, which is a metal such as copper (Cu), aluminum (Al), nickel (Ni), or a specially-developed alloy, can be used to form the redistribution layer. Processes such as electroplating over seed layers can be used for Cu or Ni, or more specialized metal MEMS techniques such as LIGA (German for Lithography, Electroplating, and Molding) can be used to form high aspect ratio actuator structures. In the simplest embodiments, a single RDL can be used to form the anchors, actuators, and bump pads. Actuators using multiple RDL are comprehended by decision diamond 1209 asking whether an additional RDL is required, which if answered yes, takes the optional return path 1211 back to depositing another dielectric layer 1202 before forming the next RDL in 1205 again. In embodiments using tie vias between RDL layers, optional step 1210 is performed to form the tie vias between RDL layers; this optional step 1210 may be associated with the dielectric layer deposition and patterning step in 1202. If no more additional RDL are required, decision diamond 1209 directs the flow to the last few steps: step 1212, depositing a last dielectric layer; and then step 1219, depositing under bump metallization (which may take several steps in practice). Finally, to form a complete WLCSP, solder bumps are attached, or formed by a deposition process such as stencil printing and reflow, in step 1220, "form solder bumps." The result of the process is a complete wafer-level packaged IC having expansion compensating structures as stress-relieving features upon reaching the stop block 1230.

Referring now to FIG. 12B, a more detailed flow chart for a method 1300 to fabricate expansion compensated wafer-level chip-scale packages is presented. This more detailed flow chart is based upon a specific common commercial RDL process using a polymer dielectric such as polyimide or BCB, and electroplating to deposit an RDL metal, which is typically Cu. In step 1301, an IC wafer is provided to start the process. A polymer dielectric layer is deposited in step 1302, which forms a typically 4-7-µm thick dielectric layer. Then comes a patterning step 1303 using the ANCHOR mask to open windows in the dielectric for anchor vias that reach down to the IC bond pads: depending on the dielectric and accuracy required, this step may be performed by direct photolithography on the polymer, or for more accurate dimensions use photoresist and masking plus etching of the polymer dielectric to form the windows. Step 1303 has a dashed outline to mark it as an optional step, because in later passes resulting from choosing return path 1311 (to form additional RDL), this step would not be used to form anchors. Step 1304, sputter RDL seed layer, is used to blanket the entire wafer with typically Ti and Cu to prepare for electroplating. It is also an optional step in later passes to form additional RDL layers, since only one seed layer deposition step may be required to make contact for plating multiple layers. Next, in step 1305, the traces and actuators (anchor tops, beams, and bump pads on the RDL layer) are defined using photolithographic patterning with the RDL mask to open areas to be plated. Step 1306, deposit RDL metal, is an electroplating step for a Cu RDL, which is typically about 4 µm thick. The photoresist used as the plating template is stripped in step 1307, and if there are no additional RDL, i.e. this is the last pass to fabricate RDL, then in step 1308, the areas of thin seed layer outside the thick electroplated RDL actuators and traces may be etched off. Step 1309 is a decision block in which if additional RDL are required (YES) either for thicker actuators or for additional redistribution, optional loop path 1311 is selected. In embodiments that utilize tie vias between RDL layers, optional step 1310 is invoked to use lithography and etching to make small vias for a subsequent RDL layer to fill. Depending on the via technology, e.g. if these vias are not built-up posts, but instead similar to the vias used for attaching anchors to the bond pads, the tie vias may be formed after the next dielectric layer is deposited in another pass through step 1302 and using the same process as described above for step 1303, but using the TIE mask. The other steps 1304 through 1308 are then as described above for the last pass of RDL.

After the last RDL layer is finished, then decision block 1309 will exit in the (NO) path and the process moves on to step 1312, in which a final (last) dielectric layer is deposited. The remaining steps are related to forming multilayer under bump metallization (UBM) as an interface to solder bumps. After the last dielectric layer is deposited to cover the RDL traces and actuators, the last dielectric is patterned using the BUMP mask in step 1313 in order to open windows to the RDL layer. A seed layer is deposited, typically by sputtering, in step 1314 to prepare for further electroplating of UBM. Then photoresist and any required hard masking layer are applied and patterned in step 1315 using the PAD mask. The under bump metallization stack begins in step 1316 with electroplating of a Cu core, and then the photoresist is removed in step 1317, after which the seed layer is etched off in step 1318 from areas that were covered by photoresist and therefore have not been plated. In step 1319, the UBM metal layers are completed by electroless plating of Ni and immersion Au to form a good metallic surface for solder. Finally, in step 1320, solder bumps are formed using one of a variety of techniques; for example, they can be applied as pre-formed balls, or stenciled on as solder paste that is then reflowed to form balls on the UBM pads. After solder bumps are formed, in step 1330, the process stops with a complete wafer-level packaged IC having expansion-compensating structures according to an embodiment of the present invention.

Although preferred embodiments have been described herein in which actuators are formed on a substrate having a lower CTE and configured to move bump pads radially outward from a neutral point to match a displacement of connection locations on a higher-CTE substrate, variations are possible in which actuators may be formed on the higher-CTE substrate to move the connection locations radially inward toward a neutral point, or in which some actuators are formed on both substrates, or even to act on the same connection location from both substrates. Variations are also possible in which a separate micromechanical "compensating chip" is fabricated using a fine-pitch MEMS process to perform the CTE matching function, and which may be used as an interposer, or may be associated with the higher-CTE substrate, with or without additional compliant links connecting the compensating chip to the higher-CTE substrate. The design, placement and orientation of expansion compensating structures formed according to the present invention may be optimized and combined in various ways, not just to implement radial motion from a neutral point, but for example to minimize the displacement required by the actuators, or to compensate for anisotropic or nonlinear thermal expansion of one or more mating substrates. Not all bump pads on an expansion compensated package or interconnect may need to be provided with actuators. Some high-current or thermal connections, especially at smaller distances from the neutral point (DNP), may use conventional rigidly-attached bump pads or connections, while bump pads or lands at larger DNP, or as otherwise required by thermal expansion movement, including non-uniform heating, may be equipped with expansion compensating structures.

The principle of fabricating micromechanical actuators on one or both of two mating substrates having mismatched coefficients of thermal expansion (CTE) in order to compensate for the differences therebetween is general, and thus the present invention may be applied not only in the field of IC packaging but also in other fields within and outside of electronics that could benefit from maintaining alignment of mating structures across temperature variations.

While the present invention has been particularly shown and described in detail in the foregoing specification with reference to specific exemplary embodiments thereof, it will be evident that various modifications and changes may be made thereto without departing from the broader spirit and scope of the invention as set forth in the appended claims. The specification and drawings are, accordingly, to be regarded in an illustrative rather than a restrictive sense.

We claim:

1. An expansion compensating structure in an integrated circuit package, the package having a package substrate and at least one redistribution layer substantially parallel to a first surface of the package substrate, comprising:
   an anchor rigidly attached to the package substrate;
   a bump pad formed in the at least one redistribution layer; and
   an actuator formed in the at least one redistribution layer, connected between the anchor and the bump pad, and configured to move the bump pad approximately along a line lying in a plane parallel to the first surface of the package substrate by a predetermined displacement for a given change in a temperature of the package.

2. The expansion compensating structure of claim 1, further comprising a handle portion connected between the actuator and the bump pad.

3. The expansion compensating structure of claim 1, further comprising a compliant link connected between the actuator and the bump pad.

4. The expansion compensating structure of claim 1, wherein the package substrate is made of silicon.

5. The expansion compensating structure of claim 1, wherein the package substrate comprises a substrate of an integrated circuit.

6. The expansion compensating structure of claim 1, wherein the actuator comprises a chevron-type actuator.

7. The expansion compensating structure of claim 6, wherein the chevron-type actuator comprises a plurality of chevron structures configured so as to act together in parallel.

8. The expansion compensating structure of claim 6, wherein a beam of the chevron-type actuator further comprises a plurality of narrowed sections separated by at least one wide section.

9. The expansion compensating structure of claim 1, wherein the actuator comprises a plurality of actuator layers formed in a plurality of redistribution layers, whereby a thickness of the actuator is increased to stiffen the actuator against out-of-plane buckling.

10. The expansion compensating structure of claim 9, further comprising a plurality of tie vias connecting at least two of the plurality of actuator layers.

11. An expansion compensated package for integrated circuits comprising:
    a package substrate having a first coefficient of thermal expansion and a first surface with a neutral point;
    at least one redistribution layer substantially parallel to the first surface of the package substrate; and
    a plurality of expansion compensating structures, each expansion compensating structure comprising
    an anchor rigidly attached to the package substrate,
    a bump pad formed in the at least one redistribution layer, and
    an actuator formed in the at least one redistribution layer, connected between the anchor and the bump pad, and configured to move the bump pad approximately along a line lying in a plane parallel to the first surface of the package substrate by a predetermined displacement for a given change in a temperature of the package,
    the expansion compensating structures placed and oriented so as to position the bump pads in a predetermined pattern at a first temperature, with the actuators further configured to move the bump pads radially outward from the neutral point at a temperature greater than the first temperature,
    whereby the expansion compensated package may be attached at the bump pads to a higher-level interconnect having a second coefficient of thermal expansion greater than the first coefficient of thermal expansion, and the radial motion of the bump pads due to the actuators compensates for a difference between the first and second coefficients of thermal expansion.

12. The expansion compensated package of claim 11, wherein the package substrate is made of silicon.

13. The expansion compensated package of claim 11, wherein the package substrate comprises a substrate of an integrated circuit.

14. The expansion compensated package of claim 11, wherein the package substrate comprises an interposer.

15. The expansion compensated package of claim 11, wherein the displacement of each bump pad from the predetermined pattern is approximately proportional to a distance of the bump pad from the neutral point.

16. The expansion compensated package of claim 11, further comprising at least one bump pad that is not moved by an actuator.

17. The expansion compensated package of claim 11, wherein the bump pads comprise lands in a land grid array.

18. The expansion compensated package of claim 11, further comprising a plurality of solder bumps, each attached to a bump pad.

19. An expansion compensated assembly comprising:
at least one expansion compensated IC package, each package comprising
a package substrate having a first coefficient of thermal expansion and a first surface with a neutral point,
at least one redistribution layer substantially parallel to the first surface of the package substrate, and
a plurality of expansion compensating structures formed in the at least one redistribution layer, each expansion compensating structure comprising
an anchor rigidly attached to the package substrate,
a bump pad formed in the at least one redistribution layer, and
an actuator formed in the at least one redistribution layer, connected between the anchor and the bump pad, and configured to move the bump pad approximately along a line lying in a plane parallel to the first surface of the package substrate by a predetermined displacement for a given change in a temperature of the package,
the expansion compensating structures placed and oriented so as to position the bump pads in a predetermined pattern at a first temperature, with the actuators further configured to move the bump pads radially outward from the neutral point at a temperature greater than the first temperature; and
a higher-level interconnect having a second coefficient of thermal expansion higher than the first coefficient of thermal expansion,
the at least one expansion compensated IC package connected to the higher-level interconnect at a plurality of connection locations corresponding to positions of the bump pads at the first temperature, whereby the radial motion of the bump pads due to the actuators compensates for a difference between the first and second coefficients of thermal expansion, reducing a stress at the plurality of connection locations.

20. The expansion compensated assembly of claim 19, further comprising a plurality of solder balls attached to the higher-level interconnect, whereby the expansion compensated assembly can be connected to another interconnect structure.

* * * * *